US012564099B2

(12) United States Patent
Kim et al.

(10) Patent No.: US 12,564,099 B2
(45) Date of Patent: Feb. 24, 2026

(54) SEMICONDUCTOR PACKAGE

(71) Applicant: Samsung Electronics Co., Ltd., Suwon-si (KR)

(72) Inventors: Hyunseok Kim, Anyang-si (KR); Dahye Lee, Anyang-si (KR); Wanho Park, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 565 days.

(21) Appl. No.: 17/946,461

(22) Filed: Sep. 16, 2022

(65) Prior Publication Data

US 2023/0131531 A1     Apr. 27, 2023

(30) Foreign Application Priority Data

Oct. 27, 2021     (KR) ........................ 10-2021-0144339

(51) Int. Cl.
| | |
|---|---|
| *H01L 25/065* | (2023.01) |
| *H01L 23/00* | (2006.01) |
| *H01L 23/31* | (2006.01) |

(52) U.S. Cl.
CPC ...... *H01L 25/0657* (2013.01); *H01L 23/3128* (2013.01); *H01L 24/06* (2013.01); *H01L 24/32* (2013.01); *H01L 24/48* (2013.01); *H01L 24/73* (2013.01); *H01L 2224/04042* (2013.01); *H01L 2224/06135* (2013.01); *H01L 2224/32145* (2013.01); *H01L 2224/48091* (2013.01); *H01L 2224/48147* (2013.01); *H01L 2224/48227* (2013.01); *H01L 2224/73215* (2013.01); *H01L 2224/73265* (2013.01);
(Continued)

(58) Field of Classification Search
CPC ............................................ H01L 2225/06562
See application file for complete search history.

(56) References Cited

U.S. PATENT DOCUMENTS

| | | |
|---|---|---|
| 7,368,811 B2 | 5/2008 | Kang et al. |
| 7,928,551 B2 | 4/2011 | Fujiwara et al. |
| 8,198,728 B2 | 6/2012 | Nishimura |

(Continued)

FOREIGN PATENT DOCUMENTS

| | | |
|---|---|---|
| JP | 2011-054725 A | 3/2011 |
| KR | 10-2012-0006352 A | 1/2012 |
| KR | 10-2019-0099815 A | 8/2019 |

*Primary Examiner* — Yu-Hsi D Sun
(74) *Attorney, Agent, or Firm* — Muir Patent Law, PLLC

(57) ABSTRACT

A semiconductor package includes: a package substrate, a first stack structure disposed on the package substrate, the first stack structure including first semiconductor chips stacked and connected to each other by bonding wires, a second stack structure disposed on the first stack structure, and including second semiconductor chips stacked, the second stack structure having an overhang region protruding beyond an uppermost first semiconductor chip of the first stack structure among the first semiconductor chips, an adhesive member covering a lower surface of the second stack structure and adhered to a portion of upper surfaces of the first stack structure, and an encapsulant disposed on the package substrate and covering the first stack structure and the second stack structure, wherein at least a portion of the bonding wires are buried in the die adhesive film in the overhang region to support the second stack structure.

20 Claims, 13 Drawing Sheets

(52) U.S. Cl.
CPC ............... *H01L 2225/06506* (2013.01); *H01L 2225/0651* (2013.01); *H01L 2225/06562* (2013.01)

(56) References Cited

U.S. PATENT DOCUMENTS

| | | |
|---|---|---|
| 9,754,927 B2 | 9/2017 | Liu et al. |
| 10,784,244 B2 | 9/2020 | Han et al. |
| 10,847,488 B2 | 11/2020 | Tsai |
| 2005/0266602 A1 | 12/2005 | Hawthorne |
| 2010/0044861 A1 | 2/2010 | Chiu et al. |
| 2011/0175222 A1* | 7/2011 | Kim .................... H01L 23/3128 |
| | | 257/737 |
| 2015/0303175 A1 | 10/2015 | Kim |
| 2021/0082878 A1* | 3/2021 | Arai ........................ H01L 24/85 |

* cited by examiner

SEMICONDUCTOR PACKAGE

CROSS-REFERENCE TO RELATED APPLICATION(S)

This application claims benefit of priority to Korean Patent Application No. 10-2021-0144339 filed on Oct. 27, 2021 in the Korean Intellectual Property Office, the disclosure of which is incorporated herein by reference in its entirety.

BACKGROUND

The present inventive concept relates to a semiconductor package.

With the development of the electronics industry, demand for high-functionality, high-speed, and miniaturization of electronic components has increased. In line with this trend, a semiconductor packaging method of stacking and mounting a plurality of semiconductor chips on a semiconductor substrate or stacking a package on a package has increasingly been used. Since semiconductor chips or packages are stacked, it has been important to stably support the semiconductor chip structure stacked thereabove.

SUMMARY

An aspect of the present inventive concept is to provide a semiconductor package having an improved production yield.

According to an aspect of the present inventive concept, a semiconductor package, includes: a package substrate having a first surface and a second surface, opposite to the first surface, a first stack structure disposed on the first surface of the package substrate, the first stack structure including at least two first semiconductor chips stacked in a step shape and connected to each other by bonding wires, a second stack structure attached to the first stack structure by a die attach film, and including at least two second semiconductor chips stacked in a step shape, the second stack structure having an overhang region protruding beyond an uppermost first semiconductor chip of the first stack structure among the first semiconductor chips, and an encapsulant disposed on the package substrate and covering the first stack structure and the second stack structure, wherein at least a portion of the bonding wires are buried in the die adhesive film in the overhang region to support the second stack structure.

According to an aspect of the present inventive concept, a semiconductor package, includes: a package substrate, a first semiconductor chip disposed on the package substrate, a lower stack structure stacked on the first semiconductor chip in a cascade structure, and including m second semiconductor chips electrically connected to each other by first bonding wires, an upper stack structure attached to the lower stack structure by an adhesive member, and including n third semiconductor chips stacked in a cascade structure, the upper stack structure having an overhang region protruding externally of an m-th second semiconductor chip disposed on an uppermost layer of the lower stack structure among the second semiconductor chips, when viewed from a direction perpendicular to a top surface of the package substrate, and an encapsulant disposed on the package substrate and covering the upper stack structure and the lower stack structure, wherein at least a portion of the bonding wires are buried in the adhesive member in the overhang region to support the upper stack structure.

According to an aspect of the present inventive concept, a semiconductor package, includes, a package substrate, a first stack structure including first semiconductor chips disposed on the package substrate, and stacked in a step shape and connected to each other by bonding wires, a second stack structure disposed on the first stack structure, and including second semiconductor chips stacked in a step shape, the second stack structure having an overhang region protruding beyond an uppermost first semiconductor chip of the first stack structure among the first semiconductor chips, when viewed from a direction perpendicular to a main surface of the package substrate, an adhesive member covering a lower surface of the second stack structure, and adhered to a portion of an upper surface of the first stack structure, and an encapsulant disposed on the package substrate and covering the first stack structure and the second stack structure, wherein at least a portion of the bonding wires are buried in the adhesive member in the overhang region to support the second stack structure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
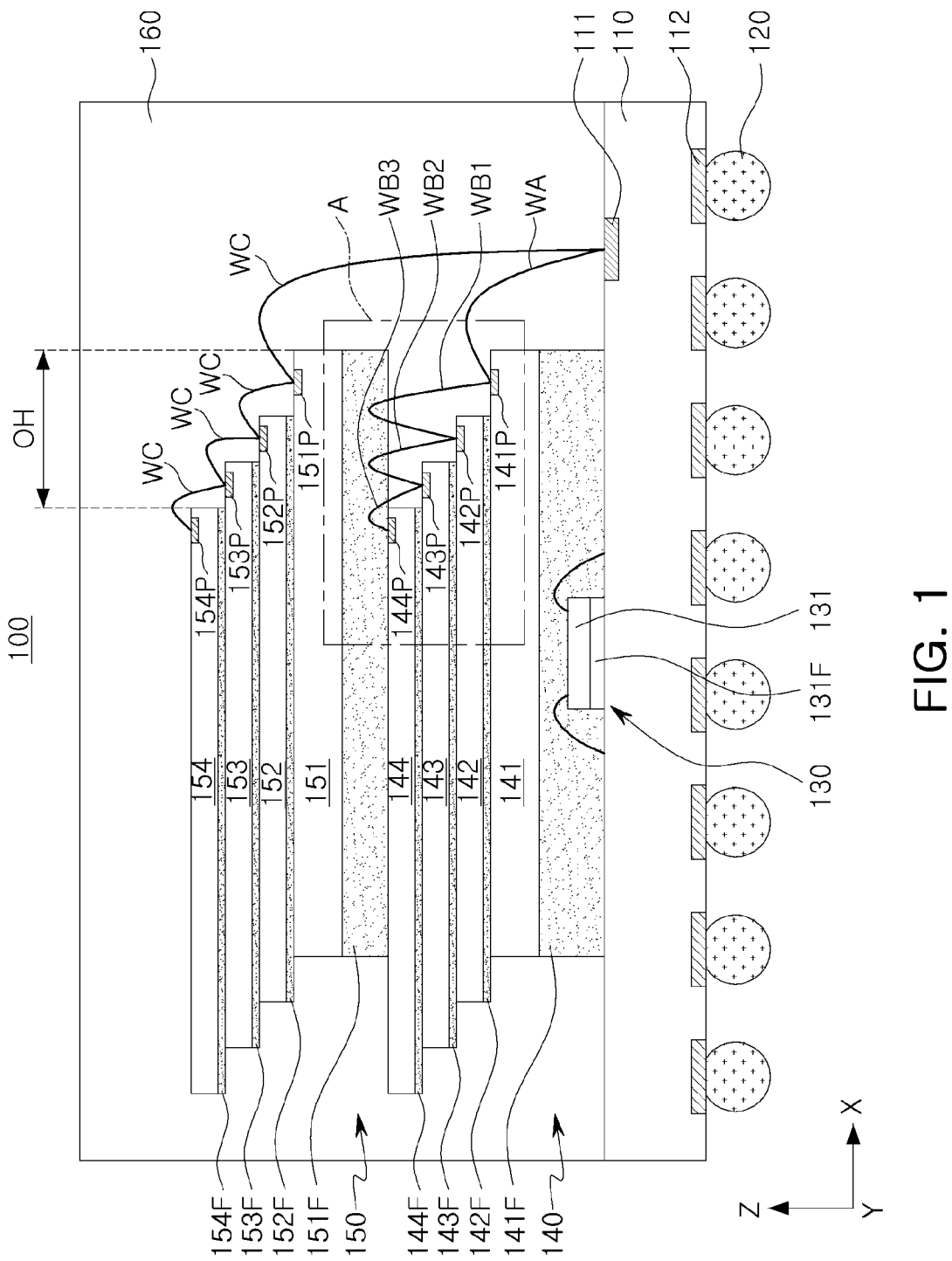
FIG. 1 is a cross-sectional view illustrating an X-Z plane of a semiconductor package according to an example embodiment of the present inventive concept.
Figure 2:
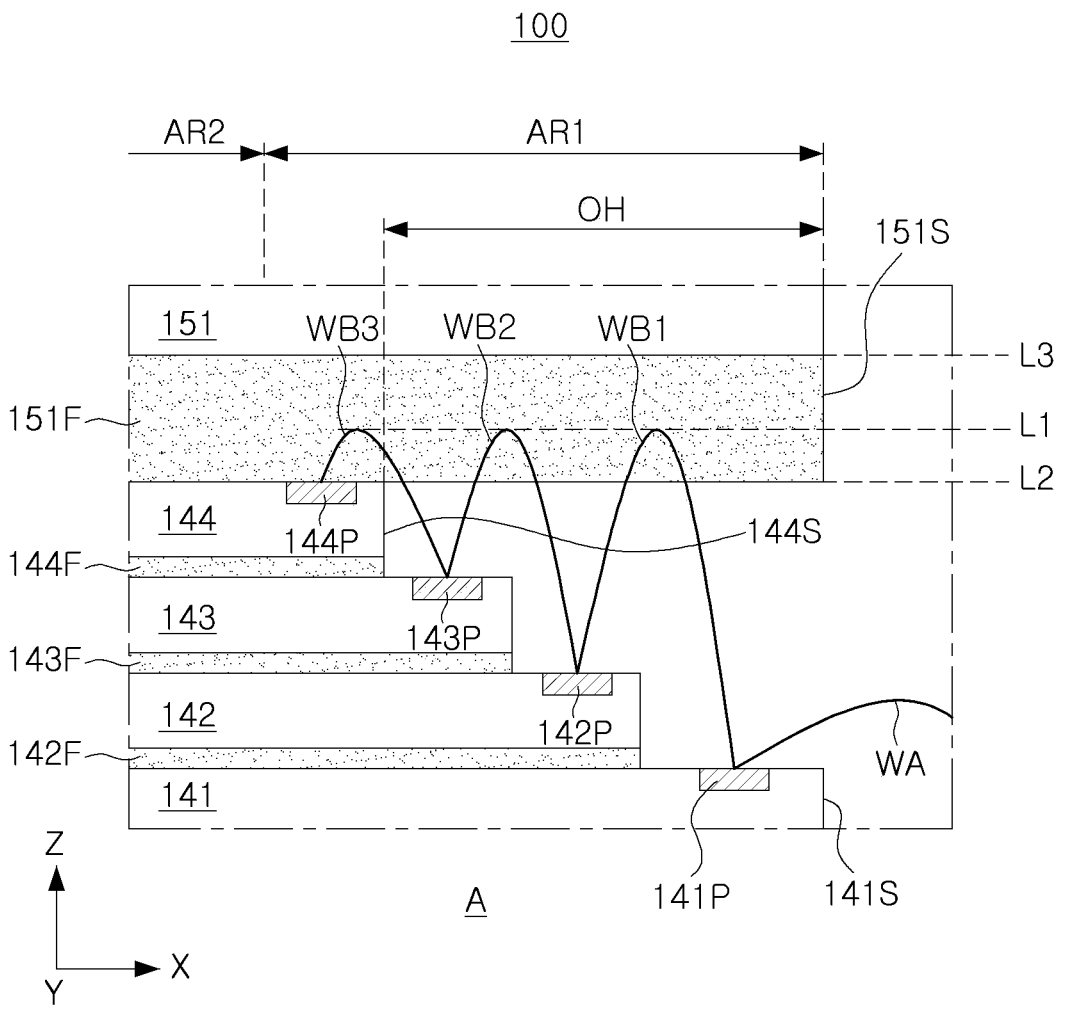
FIG. 2 is an enlarged view of portion A of FIG. 1.
Figure 3:
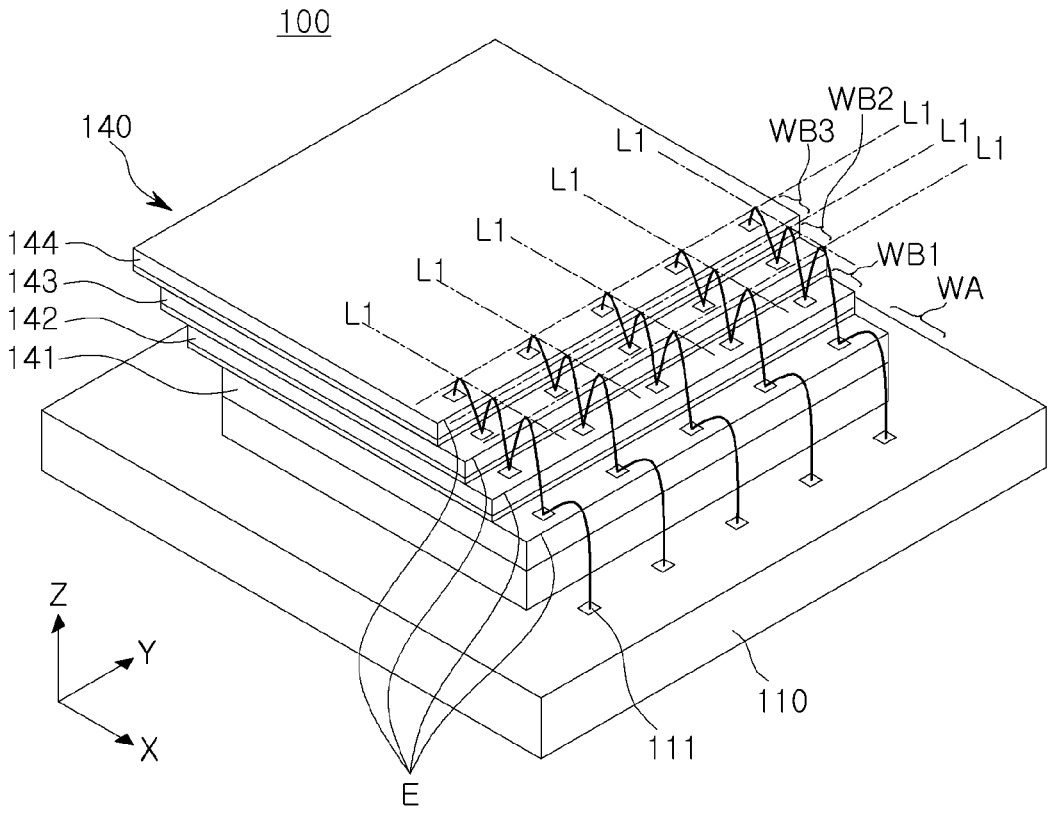
FIG. 3 is a perspective view illustrating some components of the semiconductor package illustrated in FIG. 1.

FIG. 1 is a cross-sectional view illustrating an X-Z plane of a semiconductor package according to an example embodiment of the present inventive concept, and FIG. 2 is an enlarged view of portion A of FIG. 1. FIG. 3 is a perspective view illustrating some components of the semiconductor package illustrated in FIG. 1.

Referring to FIGS. 1 and 2, a semiconductor package 100 according to an example embodiment may include a package substrate 110, a lower stack structure 140, an upper stack structure 150, and an encapsulant 160. In addition, the semiconductor package 100 may further include a plurality of connection bumps 120 disposed below the package substrate 110.

The package substrate 110 may include an upper pad 111 and a lower pad 112 respectively disposed on an upper surface and a lower surface thereof. Though only one upper pad 111 and one lower pad 112 is described, a plurality of upper pads and lower pads will be included, as can be seen in the various figures. Throughout the specification, a number of components may be described only in the singular to describe one of a plurality of such components. An internal interconnection (not shown) connecting the upper pad 111 and the lower pad 112 may be included in the package substrate 110. In some embodiments, the package substrate 110 may include or may be a printed circuit board (PCB) or a silicon interposer substrate (Si interposer substrate). The plurality of connection bumps 120 for connecting to an external device (e.g., a motherboard) may be disposed on the lower surface of the package substrate 110. The various pads described herein may be formed of a conductive material, such as a metal, for example. The internal interconnections may be formed of a conductive material, such as a metal, and may be referred to as internal wiring lines.

A first semiconductor chip 131 may be disposed on the upper surface of the package substrate 110. According to example embodiments, the first semiconductor chip 131 may be omitted. The first semiconductor chip 131 may be attached to an upper surface of the package substrate 110 by an adhesive member 131F. For example, the adhesive member 131F may be a die attach film (e.g., an insulating die attach film). The adhesive member 131F may include or may be an epoxy resin or an acrylic resin, for example. The first semiconductor chip 131 may include or may be a memory controller and/or a frequency boosting interface (FBI) chip. The memory controller can determine a data processing order of a memory chip and prevent errors and defective sectors, and the FBI chip can speed up I/O.

The lower stack structure 140 and the upper stack structure 150 may be sequentially stacked on the first semiconductor chip 131. The lower stack structure 140 may be adhered and fixed to an upper portion of the first semiconductor chip 131 by an adhesive member 141F. Adhesive member 141F may be formed of an adhesive material that forms an adhesive layer. Adhesive member 141F may contact both a bottom surface of the lower stack structure 140 and the first semiconductor chip 131.

In the case of an example embodiment, a case in which the semiconductor package 100 includes two stack structures has been described as an example, but the present inventive concept is not limited thereto, and may include three or more stack structures.

The lower stack structure 140 and the upper stack structure 150 may include second semiconductor chips 141, 142, 143, and 144 and third semiconductor chips 151, 152, 153, and 154, respectively. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). In an example embodiment, a case in which each of the lower stack structure 140 and the upper stack structure 150 includes four semiconductor chips has been described as an example, but embodiments thereof are not limited thereto, and two or more semiconductor chips may be included. For example, the lower stack structure 140 can include m semiconductor chips stacked in a cascading structure, and the upper stack structure 150 can include n semiconductor chips stacked in a cascading structure. The number of second semiconductor chips 141, 142, 143, and 144 and the number of third semiconductor chips 151, 152, 153, and 154 respectively included in the lower stack structure 140 and the upper stack structure 150 may be the same as each other. However, embodiments thereof are not limited thereto, and according to example embodiments, the number of the second semiconductor chips 141, 142, 143, and 144 and the number of the third semiconductor chips 151, 152, 153, and 154 may be different from each other. Also, sizes of the second semiconductor chips 141, 142, 143, and 144 and sizes of the third semiconductor chips 151, 152, 153, and 154 respectively included in the lower stack structure 140 and the upper stack structure 150 may be the same as each other. However, the present inventive concept is not limited thereto, and the sizes of the second semiconductor chips 141, 142, 143, and 144 and the sizes of the third semiconductor chips 151, 152, 153, and 154 may be different from each other depending on the example embodiment.

The lower stack structure 140 and the upper stack structure 150 may be formed in a cascade structure in which the second semiconductor chips 141, 142, 143, and 144 and the third semiconductor chips 151, 152, 153, and 154 are stacked in a step shape (e.g., staircase shape), respectively. Each of the second semiconductor chips 141, 142, 143, and 144 may be formed of a semiconductor chip of the same type. Each of the third semiconductor chips 151, 152, 153, and 154 may be formed of a semiconductor chip of the same type. In addition, the second semiconductor chips 141, 142, 143, and 144 and the third semiconductor chips 151, 152, 153, and 154 may be formed of semiconductor chips of the same type.

For example, the second semiconductor chips 141, 142, 143, and 144 and the third semiconductor chips 151, 152, 153, and 154 may include at least one of a logic chip such as a central processor (CPU), a graphics processor (GPU), a field programmable gate array (FPGA), a digital signal processor, a cryptographic processor, a microprocessor, a microcontroller, an analog-to-digital converter and application-specific ICs (ASICs), or a memory chip such as volatile memory (e.g. DRAM), non-volatile memory (e.g. ROM), and a flash memory. For example, when the first semiconductor chip 131 is a memory controller, the second semiconductor chips 141, 142, 143, 144 and the third semiconductor chips 151, 152, 153, and 154 may include NAND flash memory.

For example, the second semiconductor chips 141, 142, 143, and 144 may be memory chips of the same type and/or memory chips having the same capacity. The third semiconductor chips 151, 152, 153, and 154 may be memory chips of the same type and/or memory chips having the same capacity. Some or all of the second memory chips 141, 142, 143, and 144 may be memory chips of the same type and/or memory chips having the same capacity as some or all of the third memory chips 151, 152, 153, and 154. The memory chips may be phase change random access memory (PRAM), resistive random access memory (RRAM), magnetic random access memory (MRAM), dynamic random access memory (DRAM), or a flash memory device, or the like.

Referring to FIGS. 2 and 3, in the lower stack structure 140, second semiconductor chips 141, 142, 143, and 144 may be stacked in a step shape (e.g., staircase shape) in an X-axis direction, respectively (e.g., to be increasing in height in a direction toward the center of the semiconductor package 100). The second semiconductor chips 141, 142, 143, and 144 may be stacked in a plurality of layers on an upper surface of the first semiconductor chip 131 to form the lower stack structure 140. The second semiconductor chips 141 142, 143, and 144 may be adhered and fixed to each other by adhesive members 142F, 143F, and 144F. The adhesive members 142F, 143F, and 144F may be adhesive layers such as die attach films.

Bonding pads 141P, 142P, 143P, and 144P to which bonding wires are respectively connected may be disposed in edge regions E and may be disposed in a Y-axis direction along edges of each of the semiconductor chips 141, 142, 143, and 144 to be adjacent to each other. The bonding pads 141P, 142P, 143P, and 144P may be disposed to be arranged in rows in the Y-axis direction, and may be disposed to be arranged to be spaced apart from each other at regular intervals. In addition, though not shown, the bonding pads 141P, 142P, 143P, and 144P disposed on each of the second semiconductor chips 141, 142, 143, and 144 may be disposed to be arranged in rows along an X-axis direction. Bonding pads may have a circular or equilateral polygon shape, such as a square shape, when viewed from a plan view, and may have flat top and bottom surfaces. Bonding pads may electrically connect devices and/or components they are physically connected to, to transmit signals between other electrically-conductive components.

Lower bonding wires WA, WB1, WB2, and WB3 may be electrically connected to the respective bonding pads 141P, 142P, 143P, and 144P of the second semiconductor chips 141, 142, 143, and 144. The lower bonding wires WA, WB1, WB2, and WB3 may include chip-to-board bonding wires WA and chip-to-chip bonding wires WB1, WB2, and WB3. Bonding wires may be formed of a conductive material such as a metal, for example.

The chip-to-board bonding wires WA may electrically connect a package substrate 110 and a lowermost second semiconductor chip 141. The chip-to-board bonding wires WA may electrically connect an upper pad 111 of the package substrate 110 and a bonding pad 141P of the lowermost second semiconductor chip 141 to each other. An electrical signal may be transmitted between the package substrate 110 and the lowermost second semiconductor chip 141 through the chip-board bonding wires WA. For example, the chip-board bonding wires WA may not be dummy wires included for structural support only, but may be bonding wires through which electrical signals are actually transmitted, such electrical signals being used, for example, for storage, control, or other processing purposes.

The chip-to-chip bonding wires WB1, WB2, and WB3 may connect second semiconductor chips 141, 142, 143, and 144 to each other. An electrical signal may be transmitted between the second semiconductor chips 141, 142, 143, and 144 through the chip-to-chip bonding wires WB1, WB2, and WB3. As with chip-to-chip bonding wires WA, the chip-board bonding wires WB1, WB2, and WB3 may not be dummy wires, but may be bonding wires through which electrical signals are actually transmitted, such as electrical signals being used, for example, for storage, control, or other processing purposes. Accordingly, the electrical signal transmitted from the package substrate 110 through the chip-to-board bonding wires WA may be transmitted to the second semiconductor chips 141, 142, 143, and 144 through the chip-to-chip bonding wires WB1, WB2, and WB3.

As illustrated in FIG. 2, the chip-to-chip bonding wires WB1, WB2, and WB3 may be disposed to overlap, from a plan view, an overhang region OH of an upper stack structure 150, which will be described later. In addition, a portion of the chip-to-chip bonding wires WB1, WB2, and WB3 (e.g., a portion of each of the chip-to-chip bonding wires WB1, WB2, and WB3—in this case, of all three of the bonding wires WB1, WB2, and WB3) may be buried and fixed in an adhesive member 151F attached to a lower surface of the upper stack structure 150. Accordingly, the chip-to-chip bonding wires WB1, WB2, and WB3 may support an overhang region OH of the upper stack structure 150 thereabove. The adhesive member 151F may contact a top surface of the top-most semiconductor chip of the lower stack structure 140, as well as a bottom surface of the bottom-most semiconductor chip of the upper stack structure 150.

A top loop height L1 (e.g., above a top surface of the substrate 110), of a top of each of the chip-to-chip bonding wires WB1, WB2, and WB3 may be formed to be at the same vertical level, but it does not have to be completely the same, and it may vary within a range that can be buried in an adhesive member 151F attached to a lower surface of the upper stack structure 150. For example, the chip-to-chip bonding wires WB1, WB2, and WB3 may be formed to have a top loop height L1 at a level higher than a lower surface L2 of the adhesive member 151F attached to the lower surface of the upper stack structure 150, and lower than an upper surface L3 of the adhesive member 151F.

According to an example embodiment, only a portion of each of the chip-to-chip bonding wires WB1, WB2, and WB3 may be formed to be positioned at a higher level than the lower surface L2 of the adhesive member 151F attached to the lower surface of the upper stack structure 150. The chip-to-chip bonding wires WB1, WB2, and WB3 may support an overhang region OH of the upper stack structure 150, with some portions of the chip-to-chip bonding wires WB1, WB2, and WB3 being formed in the adhesive member 151F and other portions of the chip-to-chip bonding wires WB1, WB2, and WB3 not being formed in the adhesive member 151F. Some of these chip-to-chip bonding wires WB1, WB2, and WB3 may be chip-to-chip bonding wires WAB1 and WAB2 that are relatively disposed at an outer region of the stacked semiconductor chips 141-144 among the chip-to-chip bonding wires WB1, WB2, and WB3 in the X-axis direction.

Referring to FIG. 3, the chip-substrate bonding wires WA and the chip-to-chip bonding wires WB1, WB2, and WB3 may be aligned along the X-axis direction. The bonding wires WB1, WB2, and WB3 may have different lengths, with bonding wires closer to the edge of the stack of semiconductor chips 141-144 (in the X-direction) being longer than bonding wires closer to the center of the semiconductor chips 141-144.

Referring to FIGS. 1 and 2, an upper stack structure 150 may be disposed on a lower stack structure 140. In the upper stack structure 150, similarly to the lower stack structure 140, third semiconductor chips 151, 152, 153, and 154 may be stacked in a step shape along an X-axis direction, respectively. The upper stack structure 150 may be disposed to overlap the lower stack structure 140 with respect to an upper surface of the package substrate 110 (e.g., from a plan view). For example, a lowermost third semiconductor chip 151 of the upper stack structure 150 may be disposed at the same position as a lowermost second semiconductor chip 141 of the lower stack structure 140 when viewed from a Z-axis direction. For example, a side surface 151S, or each side surface 151S, of the lowermost third semiconductor chip 151 of the upper stack structure 150 may be disposed to overlap a side surface 141S, or each respective side surface 151S, of the lowermost second semiconductor chip 141 of the lower stack structure 140 in the Z-axis direction.

Between the third semiconductor chips 151, 152, 153, and 154 and between the lowermost semiconductor chip of the third semiconductor chips 151, 152, 153, and 154 and the package substrate 110 may be electrically connected by an upper bonding wire WC.

The upper stack structure 150 may have an overhang region OH protruding outwardly with respect to a side surface 144S of the uppermost second semiconductor chip 144 of the lower stack structure 140 among the second semiconductor chips 141, 142, 143, and 144. For example, the overhang region OH of the upper stack structure 150 may not be supported by the substrates of the lower stack structure 140, and may be defined as a protruding region along the X-axis direction.

The upper stack structure 150 may be attached to the lower stack structure 140 through an adhesive member 151F. The adhesive member 151F may be a die attach film. An entire region of the adhesive member 151F may be made of a single material, but the adhesive member 151F may be made of a different materials depending on a region. For example, when the adhesive member 151F is a die-adhesive film, a first region AR1 including the overhang region OH may be made of a material having a higher modulus than a second region AR2. The adhesive member 151F may include or may be an epoxy resin or an acrylic resin, for example. In this case, it is possible to more effectively prevent the overhang region OH from sagging downwardly.

The encapsulant 160 may be disposed on the package substrate 110, and may cover the lower stack structure 140 and the upper stack structure 150. The encapsulant 160 may include or be formed of an insulating material, for example, a thermosetting resin such as an epoxy resin, a thermoplastic resin such as polyimide, or a prepreg, Ajinomoto build-up Film (ABF), FR-4, BT (Bismaleimide Triazine), EMC, and the like including an inorganic filler or/and glass fiber.

The plurality of connection bumps 120 may have a form of a land, a ball, or a pin. The plurality of connection bumps 120 may include or be formed of, for example, tin (Sn) or an alloy (e.g., Sn—Ag—Cu) including tin (Sn). The plurality of connection bumps 120 may be attached to a lower pad 112 of the package substrate 110, and may be electrically connected to an external device such as a module substrate, a system board, or the like.

In the semiconductor package 100 having such a structure, since the chip-to-chip bonding wires WB1, WB2, and WB3 of the lower stack structure 140 are buried in the adhesive member 151F of the upper stack structure 150 in an overhang region OH of the upper stack structure 150, the overhang region OH of the upper stack structure 150 may be supported by the chip-to-chip bonding wires WB1, WB2, and WB3. Accordingly, the overhang region OH of the upper stack structure 150 may be prevented from being deflected by sagging downwardly, and thus a production yield of the semiconductor package 100 may be improved.

In addition, since the overhang region OH of the upper stack structure 150 is supported using a chip-to-chip bonding wire electrically connecting the semiconductor chips to each other, a production yield of the semiconductor package 100 can be improved without an additional process.

Hereinafter, modified examples of a semiconductor package will be described with reference to FIGS. 4 to 10. FIGS. 4 to 10 are views illustrating modified examples of the semiconductor package illustrated in FIG. 2.

Figure 4:
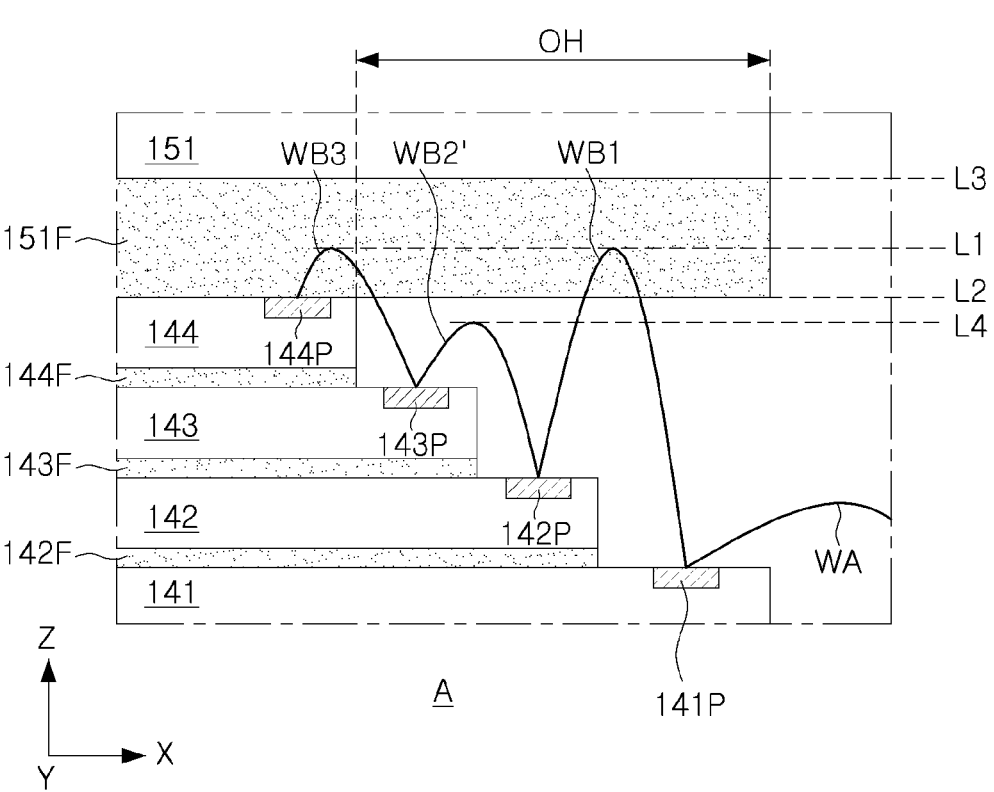
FIGS. 4 to 12 are views illustrating modified examples of a semiconductor package.

Referring to FIG. 4, there is a difference in that a semiconductor package 100a according to an example embodiment has a loop height L4 of part of the chip-to-chip bonding wires WA2' among chip-to-chip bonding wires WB1, WB2', and WB3, lower than a loop height L1 of other chip-to-chip bonding wires WB1 and WB3, as compared to the semiconductor package 100 of the above-described embodiment. Since other configurations are the same as those of the above-described example embodiment, detailed descriptions thereof are omitted to avoid overlapping descriptions.

A semiconductor package 100b of an example embodiment has a configuration in which outermost chip-to-chip bonding wires WB1 that are relatively greatly affected by a load of an overhang region OH of an upper stack structure 150 support the overhang region OH, and a loop height L4 of chip-to-chip bonding wires WB2' in an intermediate portion that are relatively minorly affected by a load of the overhang region OH is lowered. Accordingly, it is possible to minimize a length of the chip-to-chip bonding wires WB2' that are relatively minorly affected by the load of the overhang region OH. In this case, a portion of the chip-to-chip bonding wires (e.g., a portion of some of the chip-to-chip bonding wires WB1 and WB3) may be buried and fixed in adhesive member 151F. As can be seen from both FIG. 3 and FIG. 4, for the chip-to-chip bonding wires that are buried in adhesive member 151F, the wires do not pass through from a bottom surface to a top surface of the adhesive member 151F, but instead include a bent region, or loop, that has a top-most height that is within the adhesive member 151F and is below the top surface of the adhesive member 151F. For example, when a portion of the chip-to-chip bonding wires WB1 to WB3 are described as being buried and fixed in an adhesive member, at least part of one of the chip-to-chip bonding wires WB1 to WB3 are buried and fixed in the adhesive member. For example, part of two or more of the chip-to-chip bonding wires WB1 to WB3 may be buried and fixed in the adhesive member.

Figure 5:
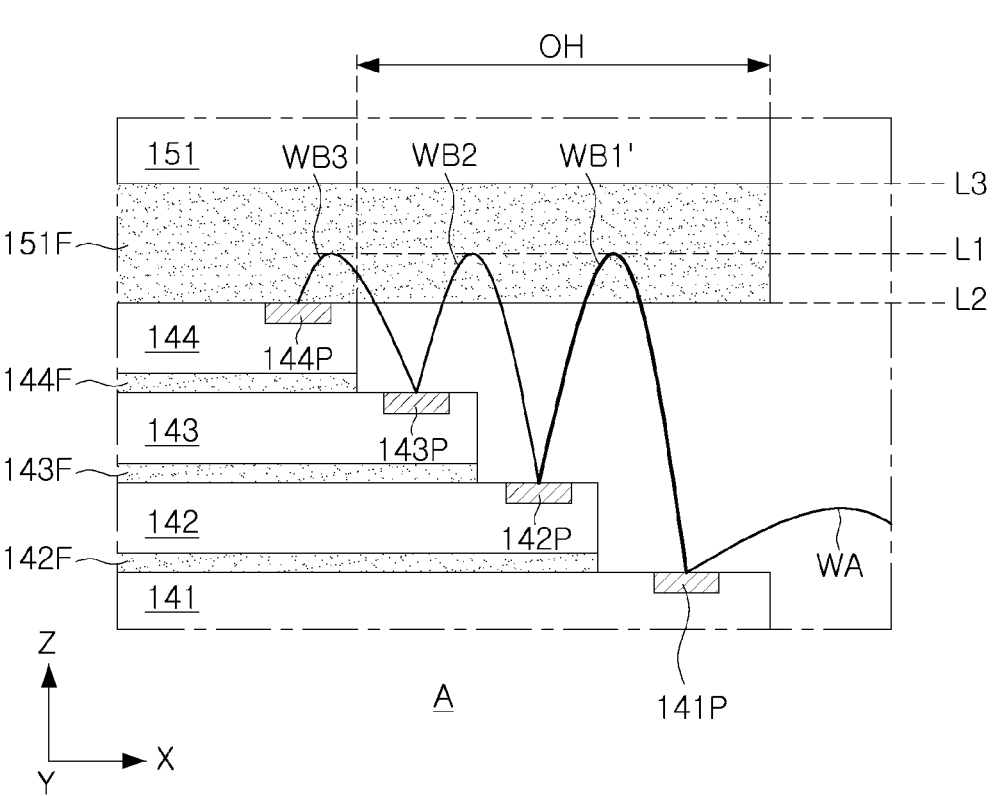

Referring to FIG. 5, there is a difference in that a semiconductor package 100b according to an example embodiment has a larger diameter of an outermost chip-to-chip bonding wires WB1' among chip-to-chip bonding wires WB1, WB2, and WB3 that are affected by a relatively large load than a diameter of other chip-to-chip bonding wires WB2 and WB3, as compared to the semiconductor package 100 of the above-described example embodiment. For example, the outermost chip-to-chip bonding wires WB1' may have a diameter of about 0.9 mil, and other chip-to-chip bonding wires WB2 and WB3 may have a diameter of about 0.7 mil. Terms such as "about" or "approximately" may reflect amounts, sizes, orientations, or layouts that vary only in a small relative manner, and/or in a way that does not significantly alter the operation, functionality, or structure of certain elements. For example, within similar magnitudes, "about" may refer a deviation up to 1% or 2%. For example, in range with different magnitudes, for example a range from "about 0.1 to about 1" may encompass a range such as a 0%-5% deviation around 0.1 and a 0% to 5% deviation around 1, especially if such deviation maintains the same effect as the listed range. Accordingly, an effect in which the outermost chip-to-chip bonding wires WB1' support a load of the overhang region OH may be further improved. Since other configurations are the same as those of the above-described example embodiment, detailed descriptions thereof are omitted to avoid overlapping descriptions.

Figure 6:
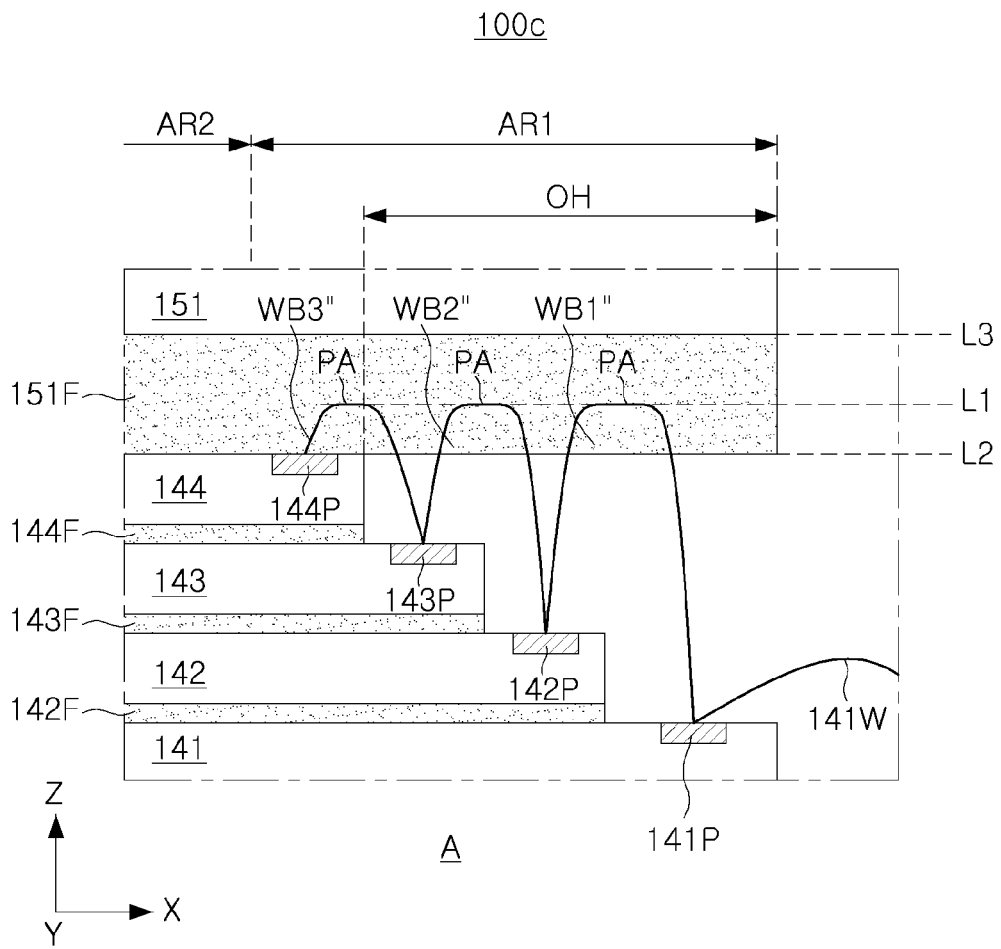

Referring to FIG. 6, there is a difference in that the semiconductor package 100c according to an example embodiment has a flat region PA in a region in which chip-to-chip bonding wires WB1", WB2", and WB3" are buried an adhesive member 151F of an upper stack structure 150, as compared to the semiconductor package 100 according to the above-described embodiment. The flat region PA of the chip-to-chip bonding wires WB1", WB2", and WB3" may evenly distribute a load of the overhang region OH in a lateral direction (X-axis direction) of the adhesive member 151F. Accordingly, an effect of the chip-to-chip bonding wires WB1", WB2", and WB3" supporting the load of the overhang region OH may be further improved. Since other configurations are the same as those of the above-described example embodiment, detailed descriptions are omitted to avoid overlapping descriptions. The flat top region features depicted in FIG. 6 may be used as part or all of the wires shown in the embodiments of FIG. 3, 4, or 5, or other figures described below.

Figure 7A:
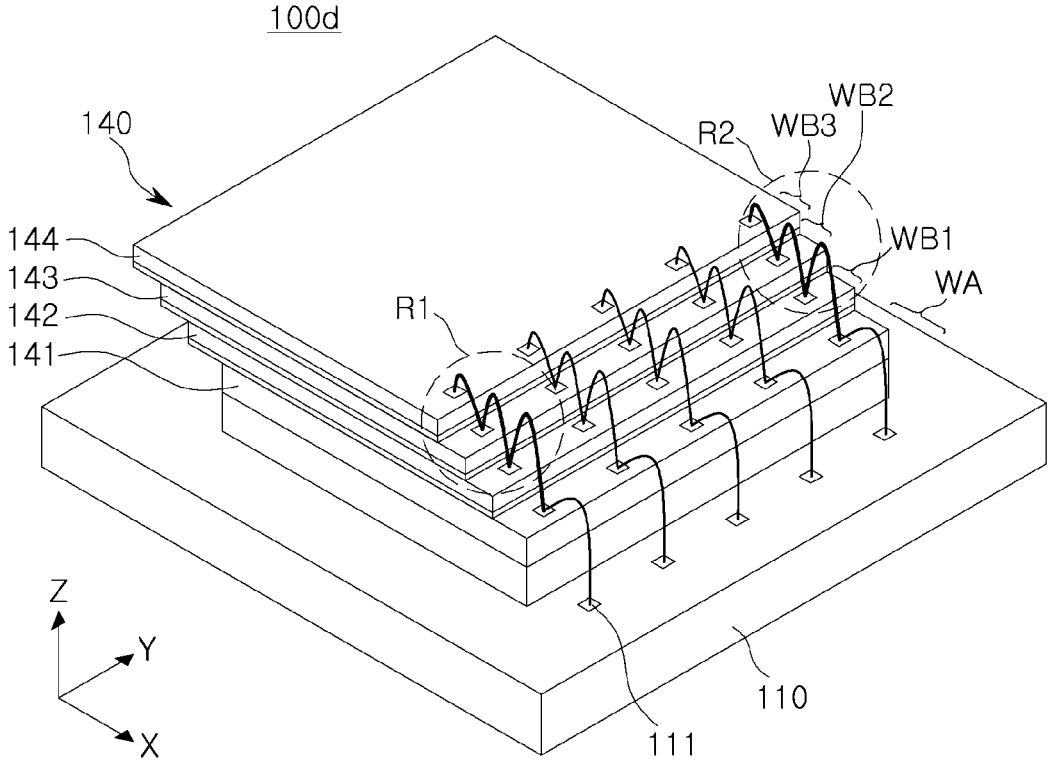

Referring to FIG. 7A, there is a difference in that a diameter of chip-to-chip bonding wires WB1, WB2, and WB3 disposed in both end regions R1 and R2 in a Y-axis direction, which relatively significantly affects a load of an overhang region OH, among chip-to-chip bonding wires WB1, WB2, and WB3 is greater than a diameter of the chip-to-chip bonding wires WB1, WB2, and WB3 in other regions, as compared to the semiconductor package 100 according to the above-described embodiment. Both end regions R1 and R2 refer to regions adjacent to respective corners of the second semiconductor chips 141, 142, 143, and 144. For example, the diameter of the chip-to-chip bonding wires WB1, WB2, and WB3 disposed in both end regions R1 and R2 may be about 0.9 mil, and the diameter of chip-to-chip bonding wires WB1, WB2, and WB3 in other regions may be about 0.7 mil. Accordingly, an effect that the chip-to-chip bonding wires WB1, WB2, and WB3 disposed in the both end regions R1 and R2 support the load of the overhang region OH may be further improved. Since other configurations are the same as those of the above-described example embodiment, detailed descriptions are omitted to avoid overlapping descriptions.

Figure 7B:
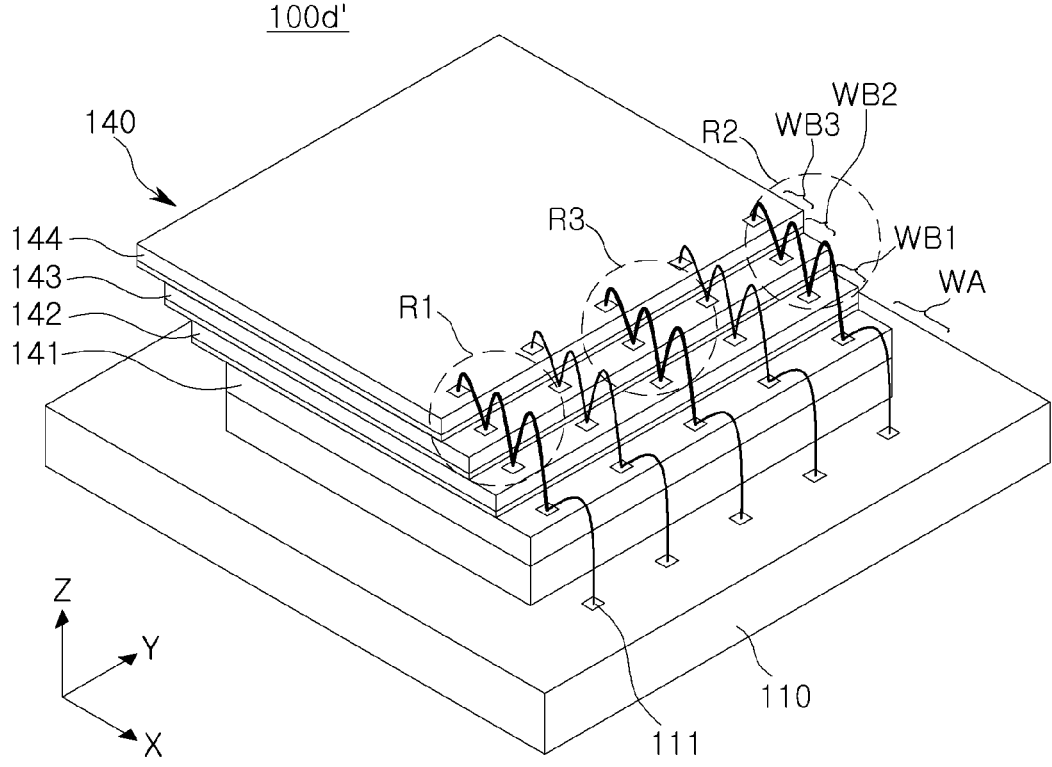

Referring to FIG. 7B, there is a difference in that a semiconductor package 100d' according to an example embodiment has a larger diameter of chip-to-chip bonding wires WB1, WB2, and WB3 disposed in a central region R3, as compared to the semiconductor package 100d of FIG. 7A. Compared to the semiconductor package 100d of FIG. 7A, in the semiconductor package 100d' of FIG. 7B, an effect in which the chip-to-chip bonding wires WB1, WB2, and WB3 support a load of the overhang region OH may be further improved. In considering FIGS. 5, 7A, and 7B, in some embodiments, at least one set of electrically connected chip-to-chip bonding wires, or at least one set of electrically isolated bonding wires connected to the same chips, may include or may be formed of bonding wires having a larger diameter than other bonding wires.

Figure 8:
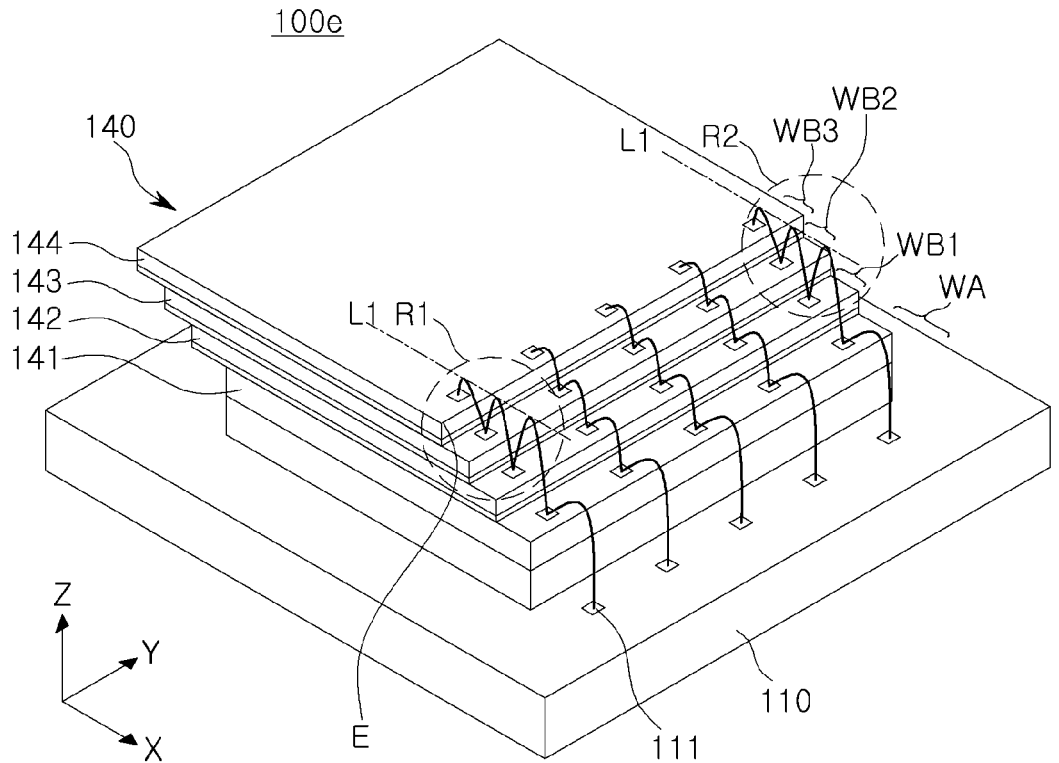

Referring to FIG. 8, as compared to the semiconductor package 100 of the example embodiment described above, in a semiconductor package 100e by an example embodiment, a loop height L1 of chip-to-chip bonding wires WB1, WB2, and WB3 disposed in both end regions R1 and R2 among chip-to-chip bonding wires WB1, WB2, and WB3 in a Y direction, that are relatively significantly affected by a load of an overhang region OH may be increased to support the overhang region OH of the upper stack structure 150, and a loop height of the other chip-to-chip bonding wires WB1, WB2, and WB3 may be reduced to minimize a length of the chip-to-chip bonding wires WB1, WB2, and WB3 in the other region, that is relatively minorly affected by a load of the overhang region OH. Since other configurations are the same as those of the above-described example embodiment, detailed descriptions thereof are omitted to avoid overlapping descriptions.

Figure 9:
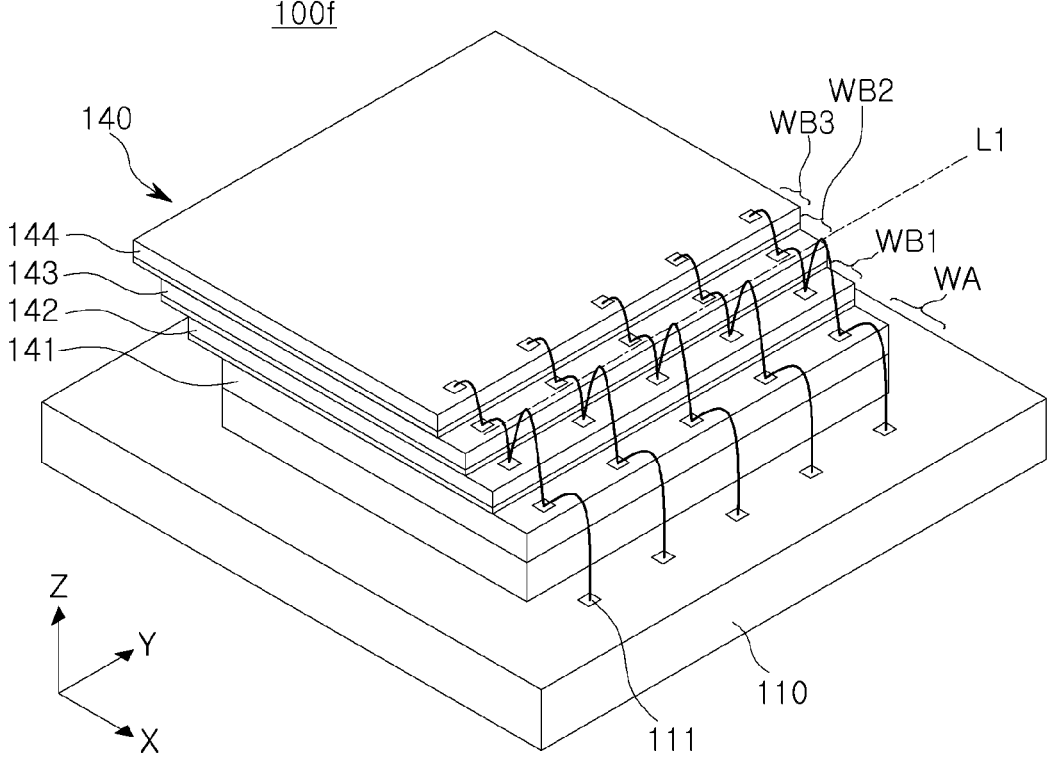

Referring to FIG. 9, as compared to the semiconductor package 100 of the example embodiment described above, in a semiconductor package 100f by an example embodiment, a loop height L1 of outermost chip-to-chip bonding wires WB1 that are relatively greatly affected by a load of an overhang region OH, among chip-to-chip bonding wires WB1, WB2, and WB3 may be increased to support the overhang region OH of the upper stack structure 150, and a loop height of the other chip-to-chip bonding wires WB1, WB2, and WB3 that are relatively less affected by a load of the overhang region OH may be reduced to minimize a length of the other chip-to-chip bonding wires WB1, WB2, and WB3. Since other configurations are the same as those of the above-described example embodiment, detailed descriptions thereof are omitted to avoid overlapping descriptions.

Figure 10:
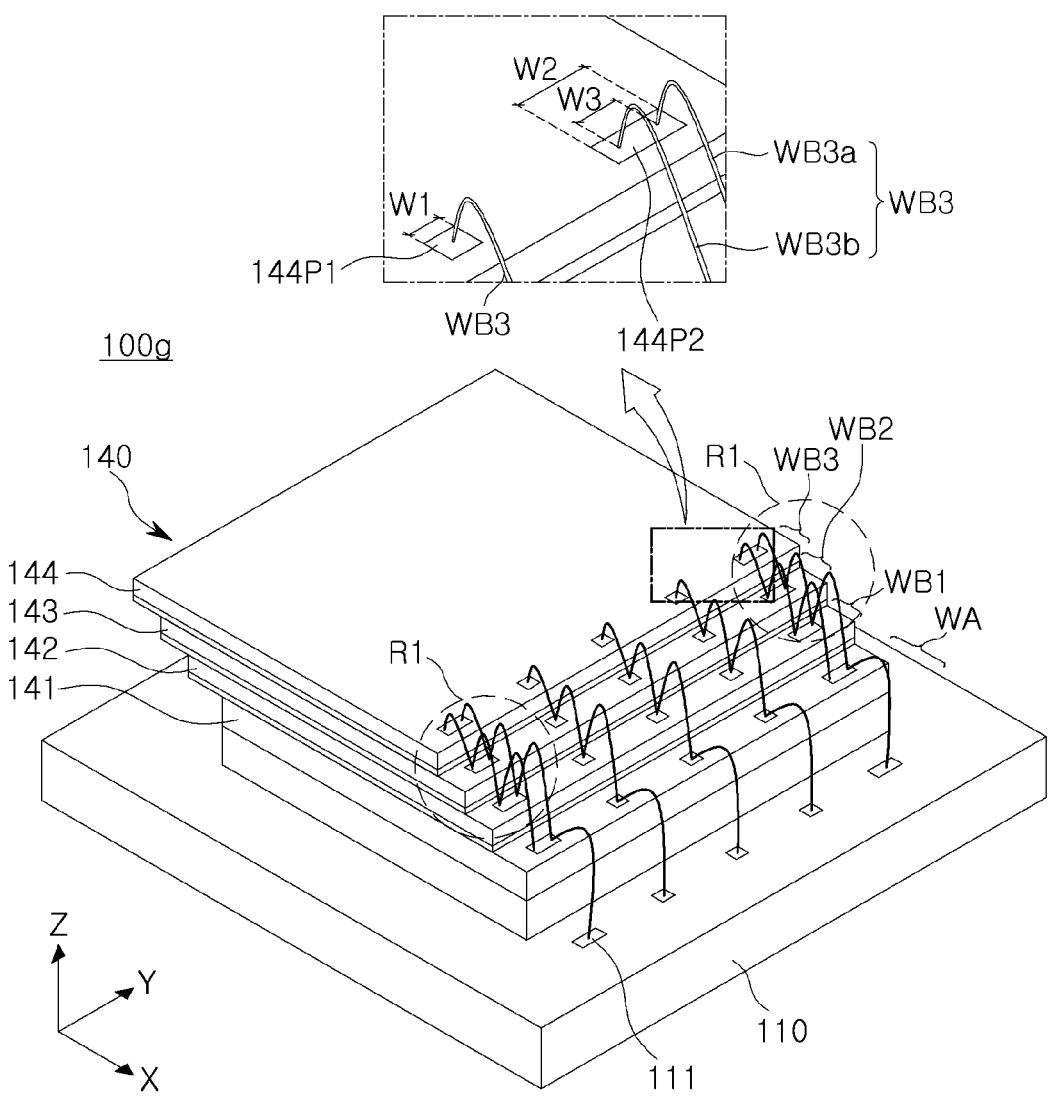

Referring to FIG. 10, a semiconductor package 100g according to an example embodiment has a difference in that the number of chip-to-chip bonding wires WB1, WB2, and WB3 disposed in both end regions R1 and R2 in a Y-axis direction that relatively significantly affects a load of the overhang region OH among the chip-to-chip bonding wires WB1, WB2, and WB3 increases, compared to the semiconductor package 100 of the above-described embodiment. For example, the chip-to-chip bonding wires WB1, WB2, and WB3 disposed in the both end regions R1 and R2 may have two chip-to-chip bonding wires WB1, WB2, and WB3, respectively, on one bonding pad 144P2 disposed therein, the chip-to-chip bonding wires WB1, WB2, and WB3 in other regions may have only one of chip-to-chip bonding wires WB1, WB2, and WB3 disposed therein, respectively. Accordingly, an effect in which the chip-to-chip bonding wires WB1, WB2, and WB3 disposed in both end regions R1 and R2 support a load of the overhang region OH may be further improved. A width W2 of the bonding pad 144P2 disposed in both end regions R1 and R2 may be twice the size of a width of a bonding pad 144P1 in other regions. However, the present inventive concept is not limited thereto, and the width W2 of the bonding pad 144P2 disposed in the both end regions R1 and R2 may be larger or smaller than twice the width W1 of the bonding pads 144P1 in other regions. The width W3 between the two chip-to-chip bonding wires WB1, WB2, and WB3 respectively on the bonding pad 144P2 may be minimized as long as they are within a range in which they are not short-circuited. Since other configurations are the same as those of the above-described exemplary embodiment, detailed descriptions are omitted to avoid overlapping descriptions.

Figure 11:
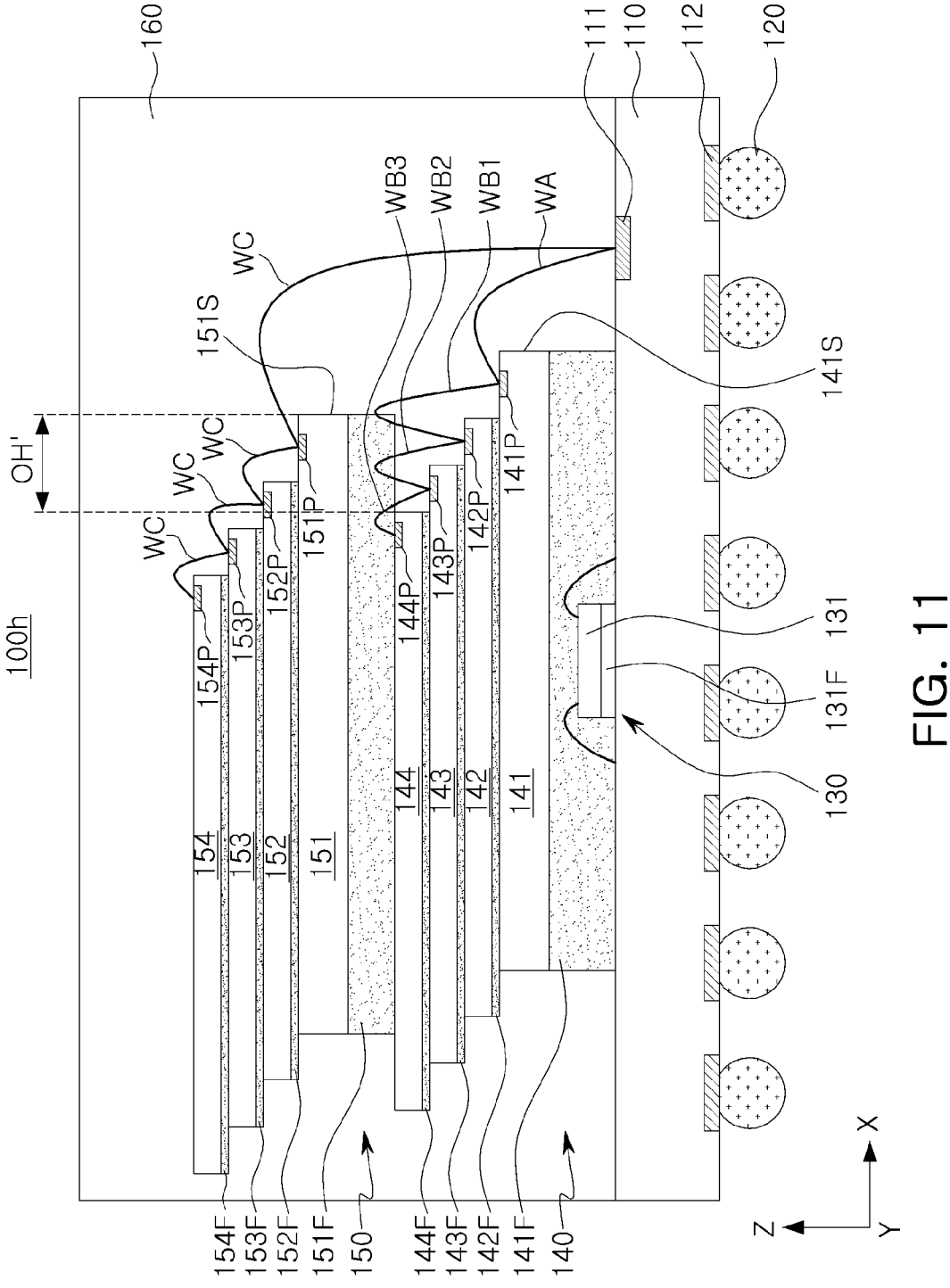
Figure 12:
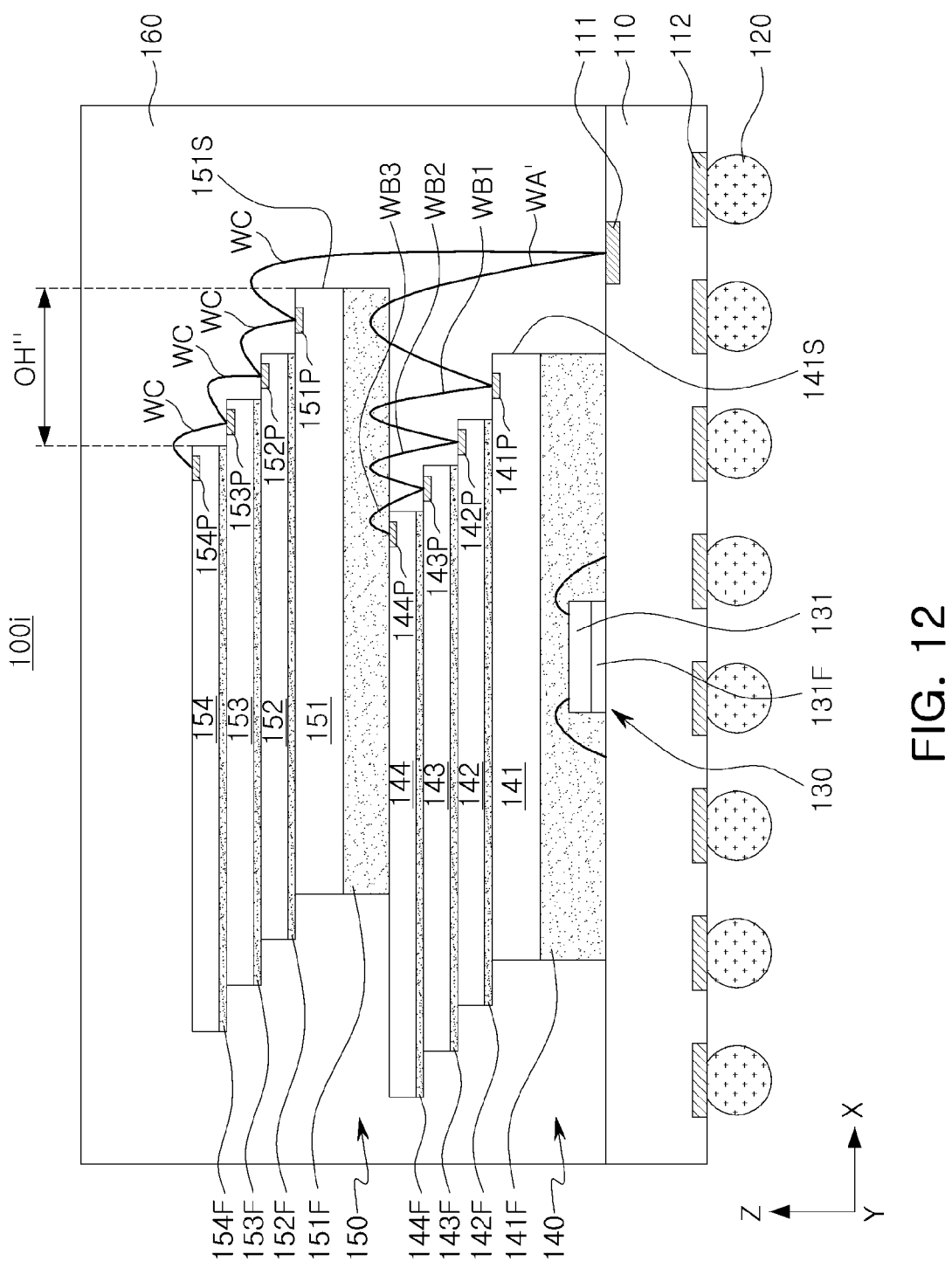

Referring to FIGS. 11 and 12, there is a difference in that semiconductor packages 100h and 100i according to an example embodiment a side surface 151S of a lowermost third semiconductor chip 151 of an upper stack structure 150 and a side surface 141S of a lowermost second semiconductor chip 141 of a lower stack structure 140 are disposed to be shifted in a X-axis direction, as compared to the above-described example embodiment.

A semiconductor package 100h of FIG. 11 illustrates an example in which a side surface 141S of a lowermost second semiconductor chip 141 of a lower stack structure 140 protrudes further than a side surface 151S of a lowermost third semiconductor chip 151 of an upper stack structure 150 in an X-axis direction. Accordingly, it can be seen that an overhang region OH' is shorter than that of the semiconductor package 100 of the above-described embodiment.

A semiconductor package 100i of FIG. 12 illustrates an example in which a side surface 151S of a lowermost third second semiconductor chip 151 of an upper stack structure 150 more protrudes than a side surface 141S of a lowermost second semiconductor chip 141 of a lowermost stack structure 140 in an X-axis direction. Accordingly, it can be seen that an overhang region OH'' is longer than that of the semiconductor package 100 according to the above-described embodiment.

As set forth above, according to an example embodiment of the present inventive concept, a semiconductor package having an improved production yield may be provided by stably supporting a semiconductor chip structure stacked thereabove by supporting an overhang region of a stack structure disposed on an upper portion with a bonding wire of the stack structure disposed on a lower portion.

Various and advantageous advantages and effects of the present inventive concept is not limited to the above description, it will be more readily understood in the process of describing the specific embodiments of the present inventive concept. In addition, the various embodiments discussed above can be combined in different ways to include features of the various embodiments together.

While the example embodiments have been shown and described above, it will be apparent to those skilled in the art that modifications and variations could be made without departing from the scope of the present inventive concept as defined by the appended claims.

What is claimed is:

1. A semiconductor package, comprising:
a package substrate having a first surface and a second surface, opposite to the first surface;
a first stack structure disposed on the first surface of the package substrate, the first stack structure including at least three first semiconductor chips stacked in a step shape and connected to each other by bonding wires, so that a first set of bonding wires connects a lowermost first semiconductor chip of the first stack structure to a next lowest first semiconductor chip of the first stack structure vertically adjacent to the lowermost first semiconductor chip;
a second stack structure attached to the first stack structure by a die attach film and including at least two second semiconductor chips stacked in a step shape, the second stack structure having an overhang region protruding beyond an uppermost first semiconductor chip of the first stack structure among the first semiconductor chips, when viewed from a direction perpendicular to the first surface of the package substrate; and
an encapsulant disposed on the package substrate and covering the first stack structure and the second stack structure,
wherein a portion of each bonding wire of the first set of bonding wires is buried in the die attach film in the overhang region, so that the first set of bonding wires supports the second stack structure.

2. The semiconductor package of claim 1, wherein the first semiconductor chips are stacked in a cascade structure, wherein additional sets of bonding wires connect additional first semiconductor chips adjacent to each other among the first semiconductor chips to each other.

3. The semiconductor package of claim 2, wherein for each respective first semiconductor chip of the first semiconductor chips, the bonding wires of a corresponding set of bonding wires from among the first set of bonding wires and the additional bonding wires are disposed to be spaced apart from each other in a row along one edge of the respective first semiconductor chip.

4. The semiconductor package of claim 2, wherein;
a first additional set of bonding wires of the additional sets of bonding wires connects two adjacent first semiconductor chips below the uppermost first semiconductor chip to each other, and
at least a portion of each bonding wire of the first additional set of bonding wires is buried in the die attach film in the overhang region so that the first additional set of bonding wires further supports the second stack structure.

5. The semiconductor package of claim 2, wherein:
the first set of bonding wires forms a first group,
the additional sets of bonding wires form a second group, and a diameter of the bonding wires of the first group is greater than a diameter of the bonding wires of the second group.

6. The semiconductor package of claim 2, wherein:
the first set of bonding wires forms a first group,
the additional sets of bonding wires form a second group, and
at least some of the bonding wires of the first group are disposed adjacent to corners of the first semiconductor chips.

7. The semiconductor package of claim 2, wherein;
the first set of bonding wires forms a first group,
the additional sets of bonding wires form a second group, and
at least some of the bonding wires of the first group have a flat region with respect to a lower surface of a lowermost second semiconductor chip among the second semiconductor chips in a region buried in the die attach film.

8. The semiconductor package of claim 2, wherein:
the first set of bonding wires forms a first group,
the additional sets of bonding wires form additional groups, and
each of the bonding wires of the first group has a top at the same height above a top surface of the package substrate as others of the bonding wires of the first group, and at the same height above the top surface of the package substrate as tops of bonding wires of a first additional group of the additional groups.

9. The semiconductor package of claim 8, wherein the bonding wires of the first group have a top at a higher height above a top surface of the package substrate than the bonding wires of a second additional group of the additional groups.

10. The semiconductor package of claim 3, wherein each first semiconductor chip further comprises bonding pads disposed spaced apart from each other in a row along the one edge.

11. The semiconductor package of claim 1, wherein each bonding wire of the first set of bonding wires includes a first portion outside of the die attach film and connected to the lowermost first semiconductor chip, a second portion outside of the die attach film and connected to the next lowest semiconductor chip, and a third portion, which is the portion buried in the die attach film and which connects the first portion to the second portion.

12. The semiconductor package of claim 1, wherein the first semiconductor chips and the second semiconductor chips are semiconductor chips of the same kind.

13. The semiconductor package of claim 1, wherein the lowermost first semiconductor chip of the first stack structure among the first semiconductor chips has substantially the same size as and is disposed to overlap a lowermost second semiconductor chip of the second stack structure among the second semiconductor chips when viewed from a plan view.

14. A semiconductor package, comprising:
a package substrate;
a first semiconductor chip disposed on the package substrate;
a lower stack structure stacked on the first semiconductor chip in a cascade structure, and including m second semiconductor chips electrically connected to each other by first bonding wires;
an upper stack structure attached to the lower stack structure by an adhesive member, and including n third semiconductor chips stacked in a cascade structure, the upper stack structure having an overhang region protruding externally of an m-th second semiconductor chip disposed on an uppermost layer of the lower stack structure among the second semiconductor chips, when viewed from a direction perpendicular to a top surface of the package substrate; and an encapsulant disposed on the package substrate and covering the upper stack structure and the lower stack structure, wherein a portion of each bonding wire of a first group of the first bonding wires is buried in the adhesive member in the overhang region so that each bonding wire of the first group supports the upper stack structure, and wherein each first bonding wire of the first group of the first bonding wires includes a first portion outside of the adhesive member and connected to a lower second semiconductor chip, a second portion outside of the adhesive member and connected to a first adjacent semiconductor chip adjacent to the lower second semiconductor chip, and a third portion, which is the portion buried in the adhesive member and which connects the first portion to the second portion.

15. The semiconductor package of claim 14, wherein at least a portion of each bonding wire of a second group of the first bonding wires is buried in the adhesive member in the overhang region so that each bonding wire of the second group supports the upper stack structure, and wherein each first bonding wire of the second group of the first bonding wires includes a first portion outside of the adhesive member and connected to the lower second semiconductor chip, a second portion outside of the adhesive member and connected to a second adjacent semiconductor chip adjacent to the lower second semiconductor chip, and a third portion which is the portion buried in the adhesive member and which connects the first portion to the second portion.

16. The semiconductor package of claim 15, wherein a topmost portion of each bonding wire of the first group of the first bonding wires is at the same height above the package substrate as a topmost portion of each bonding wire of the second group of the first bonding wires.

17. The semiconductor package of claim 14, wherein the first semiconductor chip comprises a semiconductor chip different from the second semiconductor chips, wherein the second semiconductor chips comprise a semiconductor chip of the same type as the third semiconductor chips.

18. The semiconductor package of claim 17, wherein the first semiconductor chip comprises a memory controller, and wherein each semiconductor chip of the second semiconductor chips and each semiconductor chip of the third semiconductor chips comprises a memory chip.

19. The semiconductor package of claim 14, wherein the lower second semiconductor chip is a lowermost second semiconductor chip of the lower stack structure, and the first adjacent second semiconductor chip is a next lower second semiconductor chip of the lower stack structure, and further comprising:

second bonding wires electrically connecting the package substrate and the lowermost second semiconductor chip, wherein electrical signals transmitted through the package substrate are transmitted to the next lower second semiconductor chip through the first bonding wires and the second bonding wires.

20. A semiconductor package, comprising:

a package substrate;

a first stack structure disposed on the package substrate, the first stack structure including first semiconductor chips stacked in a step shape and connected to each other by bonding wires;

a second stack structure disposed on the first stack structure, and including second semiconductor chips stacked in a step shape, the second stack structure having an overhang region protruding beyond an uppermost first semiconductor chip of the first stack structure among the first semiconductor chips when viewed from a direction perpendicular to a main surface of the package substrate;

an adhesive member covering a lower surface of the second stack structure, and adhered to a portion of an upper surface of the first stack structure; and an encapsulant disposed on the package substrate and covering the first stack structure and the second stack structure, wherein a first group of the bonding wires connects a first chip of the first semiconductor chips to a second, next higher, chip of the first semiconductor chips, and a second group of the bonding wires connects the second, next higher, chip of the first semiconductor chips to a third chip of the first semiconductor chips adjacent to the second chip, wherein a portion of each bonding wire of the first group of the bonding wires is buried in the adhesive member in the overhang region so that each bonding wire of the first group supports the second stack structure, and a portion of each bonding wire of the second group of the bonding wires is buried in the adhesive member in the overhang region so that each bonding wire of the second group additionally supports the second stack structure.

* * * * *